United States Patent [19]
Feygenson et al.

[11] Patent Number: 5,273,621
[45] Date of Patent: Dec. 28, 1993

[54] SUBSTANTIALLY FACET-FREE SELECTIVE EPITAXIAL GROWTH PROCESS

[75] Inventors: Anatoly Feygenson, Reading; John W. Osenbach, Spring Township, Berks County; Donald G. Schimmel, Muhlenberg Township, Berks County, all of Pa.

[73] Assignee: AT&T Bell Laboratories, Murray Hill, N.J.

[21] Appl. No.: 935,840

[22] Filed: Aug. 26, 1992

Related U.S. Application Data

[62] Division of Ser. No. 701,598, May 13, 1991, Pat. No. 5,168,089.

[51] Int. Cl.$^5$ ............................................. H01L 21/00
[52] U.S. Cl. ................................... 156/657; 156/662; 252/79.3
[58] Field of Search ............... 156/662, 657; 252/79.2, 252/79.3

[56] References Cited

U.S. PATENT DOCUMENTS

| | | | |
|---|---|---|---|
| 4,029,542 | 6/1977 | Swartz | 156/662 X |
| 4,071,397 | 1/1978 | Estreicher et al. | 156/662 |
| 4,456,501 | 6/1984 | Bayman et al. | 156/662 X |

*Primary Examiner*—Thi Dang
*Attorney, Agent, or Firm*—Scott W. McLellan

[57] ABSTRACT

A process for growing selective epitaxial layers on a silicon substrate. In a epitaxial growth reactor, hydrogen and the reactive gasses, the silicon source gas and hydrochloric acid, are introduced. The amount of silicon to free hydrochloric acid is controlled to be about 1:6 during the growth process and then turned off, the hydrogen remaining on. The resulting epitaxial layer may be grown over one micron in thickness with less than 0.1 micron of faceting. Further, a etchant of $H_2O$ and HF diluted in $NHO_3$ is first used to remove surface damage on the silicon substrate prior to epitaxial layer growth.

3 Claims, 1 Drawing Sheet

SUBSTANTIALLY FACET-FREE SELECTIVE EPITAXIAL GROWTH PROCESS

This is a division of application Ser. No. 07/701,598 filed May 13, 1991, now U.S. Pat. No. 5,168,089.

BACKGROUND OF THE INVENTION

1. Field of the Invention

This invention relates to silicon epitaxial growth processes, and more particularly, to selective epitaxial growth processes for integrated circuit fabrication.

2. Description of the Prior Art

Selective epitaxial growth on silicon wafers is used to form isolated regions of silicon in which devices may be formed, such as bipolar and field-effect transistors. The primary advantages gained by having isolated regions are the reduced parasitic capacitive coupling of the devices to the substrate and the excellent inter-isolation of devices formed in different regions. These advantages allow for higher speed and higher operating voltages than attainable in circuits fabricated using prior-art isolation techniques, such as the local oxidation of silicon process (LOCOS) widely used in CMOS circuit fabrication.

In general, the formation of the selective epitaxial regions or layers on a wafer involves opening windows in an oxide layer to expose the underlying substrate. This is done with conventional photolithographic techniques and anisotropic etching, such as a reactive ion etch (RIE). The wafer is then placed in a reactor and silicon is grown, and the desired dopant is simultaneously incorporated therewith, to form the epitaxial regions on the exposed substrate. One such technique is described in "Selective silicon epitaxial growth for device-isolation technology", by A. Ishitani, et al., in *Microelectronic Engineering*, Vol. 4, 1986, pp. 3/14 3. However, the described processes allow for only about 0.6 micron of silicon growth before significant faceting (here, 0.1 micron or more) occurs on the major surface of the epitaxial region. As will be discussed in more detail below, faceting is the formation of another growth plane at a different angle from the major surface of the region, typically forming at the sides of the region where it meets the wall of the oxide layer. The plane of the facet is along a different crystallographic plane than the major surface of the epitaxial region. As will be discussed in more detail below, such faceting reduces the amount of area on the major surface of the epitaxial region available for fabrication of a device for a given region size. Further, the limitation of 0.6 micron of epitaxial region thickness limits the operating voltage of the devices formed in the region before break-down of the device to the substrate occurs.

Another difficulty with the above-referenced selective growth process is the need to modify the process depending on the amount of silicon substrate area exposed on the wafer for the selective epitaxial layers to be grown. These variations are necessary so that the growth rate and, hence, the degree of facet formation, is controlled to give the desired thickness of the layer before significant faceting occurs. A consequence of this process variation is the inability of one reactor using this process to simultaneously grow consistent thickness epitaxial regions on wafers having different amounts of exposed silicon thereon.

SUMMARY OF THE INVENTION

It is one aspect of the invention to provide a method of selectively growing an epitaxial layer of a thickness which may exceed 0.6 micron without significant faceting.

It is another aspect of the invention to provide a method of selectively growing substantially consistent thickness epitaxial layers on wafers, with differing amounts of exposed silicon, in one reactor.

These and other aspects of the invention are provided for generally by a method of growing selective epitaxial layers on at least one silicon substrate in a reactor, the substrate covered with a masking layer having openings therein to expose portions of the substrate where an epitaxial layer is to be grown, characterized by the step of- flowing hydrogen, hydrochloric acid (HCl), and a silicon source gas ($SiCl_xH_y$) over the substrate at predetermined flow rates; wherein the temperature of the gases and substrate is at least about 900° C. and less than about 1100° C., the flow rate of the hydrogen at least about 15 SLM and no more than about 180 SLM, and the flow rate of the silicon source gas is at least about 50 SCCM and no more than about 150 SCCM.

It is yet another aspect of the invention to provide a method of removing substantially all surface damage on a silicon surface prior to growing the epitaxial layer thereon.

This and other aspects of the invention are provided for generally by a method of removing the surface damage by the step of subjecting the silicon surface to an etchant of $H_2O$ and HF diluted in $HNO_3$ until substantially all the damage is removed.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
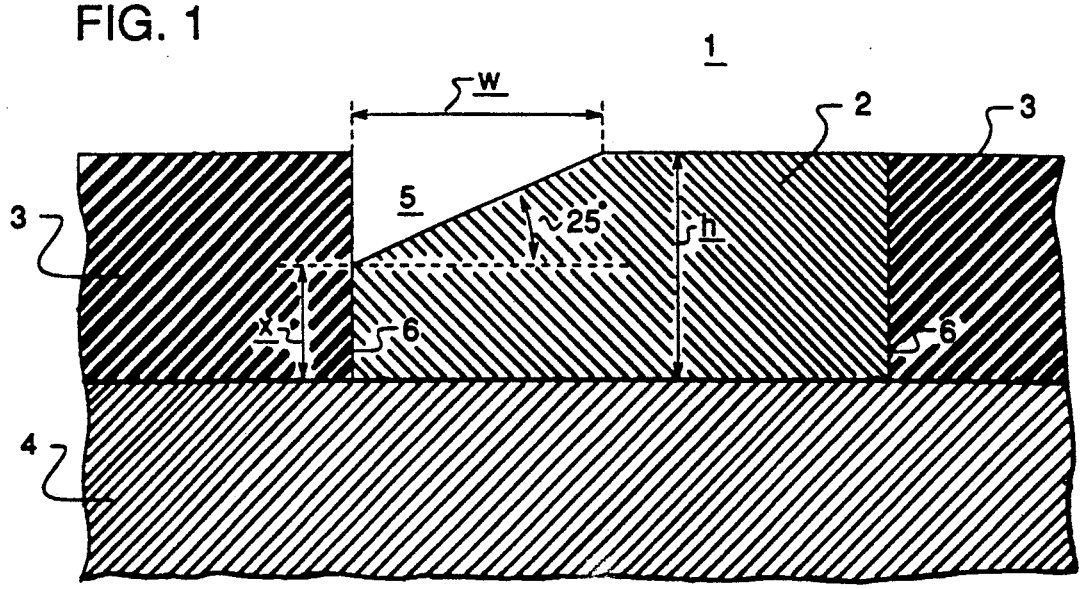
FIG. 1 is a cross-section (not to scale) of a selective epitaxial layer showing the faceting thereof.

FIG. 1 shows a cross-section (not to scale) of a silicon structure 1 having a selective epitaxial region or layer 2 in an opening of oxide 3, the opening being defined by the sidewalls 6. The epitaxial layer 2 is grown on a substrate 4, preferably by a process described below. The process by which the structure I is formed prior to the growth of the selective epitaxial layer 2 was described above. Where the layer 2 meets the sidewall 6 of oxide 3, here silicon dioxide, a facet 5 is shown. Typically, when grown at 90°-1100° C., the facet forms a plane having an angle of about 25° from the normal to the wall 6 of the oxide 3. For purposes here, the total height of the layer 2 is designated as h and the height of the layer 2 prior to the formation of the facet 5 is designated as x. Typically, the height of the oxide 3 is substantially equal to the height h of the layer 2.

As can be seen from FIG. 1, the facet 5 decreases the amount of planar surface available on the major surface of the layer 2 by the amount shown here as w. Hence, $w \approx (h-x)/\tan 25°$, where $h-x$ is the amount of faceting. In order to decrease w, and thereby increase the usable planar surface area on the major surface of layer 2, it is desirable to make the height x to be as close to the height h as possible prior to the facet 5 forming.

PREFERRED EMBODIMENTS

A wafer to have at least one selective epitaxial growth thereon has windows formed in the oxide layers 3 in a conventional manner, as described above, so as to expose portions of the substrate 4. The portions so exposed are etched to remove any residual surface damage that may have occurred during the opening of the windows, such as by RIE. The etch to remove the residual damage is preferably done by subjecting tile wafer in a dilute mixture of HF and $H_2O$ in $HNO_3$. The etchant is approximately a 10:1 mixture of $H_2O$ and HF diluted with $HNO_3$ at about a 4-10 to 400 ratio, used over a temperature range of about 20° to 40° C. Preferably, about a 6 to 400 ratio ($H_2O$:HF to $HNO_3$) is used at a temperature of about 25° C.

The wafer, along with other similarly processed wafers, is next placed in a conventional epitaxial reactor, such as an AMI 7810, made by Applied Materials, Inc., of Fremont, Calif. The wafer is heated to approximately 1025° C. in an atmosphere of $H_2$ at a flow rate of approximately 125 standard liters per minute SLM) and at a pressure of less than about 60 Torr, preferably about 1 to 55 Torr, for approximately five minutes. This substantially removes any native oxide that may have tonned on the exposed portion of substrate 4.

The temperature is then adjusted to the below-listed exemplary preferred processing parameters (shown in parenthesis) and the corresponding reactive gasses (the Si source gas and HCl) are introduced into the reactor:

TABLE 1

| Si Source | Si Source flow rate in SCCM (Preferred rate) | HCl flow rate in SCCM (Preferred rate) | $H_2$ flow rate in SLM (Preferred rate) | Temp °C. (Preferred temp) | Growth rate $\mu/m$ |
|---|---|---|---|---|---|
| $SiCl_2H_2$ | 50-150 (80) | 10 300-420 (330) | 15-180 (125) | 900-960 (950) | 0.5 |
| $SiCl_4$ | 50-150 (80) | 150-210 (165) | 15-180 (125) | 25 1025-1100 (1050) | 0.4 |
| $SiCl_3H$ | 50-150 (80) | 15 200-300 (220) | 20 15-180 (125) | 950-1060 30 (1010) | 0.6 |

The reactive gases (Si source and HCl) remain on until the desired thickness of the silicon epitaxial layer 2 is grown. It is noted that the higher growth rates apply for those wafers with the ratio of the total amount of silicon substrate 4 area exposed to the total area of the substrate, expressed as a percentage, of greater than approximately 16%. Consequently, the lower growth rates apply to smaller percentages of total substrate exposure. It is noted that the disparity is not a large one, and a median growth rate may be used for growth time calculations. This makes the process relatively insensitive to exposure percentages, compared to the prior art. It is preferable, however, to group wafers together in one reactor by exposure percentage to achieve better control of the resulting epitaxial layer 2 thickness. This grouping may be divided by those with exposure greater than, and those with exposure less than, 16%.

Once the reactive gases are turned off, except the hydrogen, the reactor is allowed to ramp down in temperature to approximately 850° C. Then the hydrogen is turned off and the reactor purged with nitrogen until room temperature is reached. The wafers may then be processed using conventional device fabrication techniques to form silicon devices in the layer 2, such as bipolar and field-effect transistors, resistors, capacitors, diodes, etc.

It is understood that the temperatures, pressures, and flow rates shown in Table 1 are all approximate and may be varied within the ranges shown. However, it has been found that the ratio of Si to free HCl is important to the proper growth of the epitaxial layer 2. The ratio of Si to free HCl may range from about 1:5 to 1:8 and is preferably approximately 1:6, or one silicon atom for every six hydrochloric acid molecules, for a substantially minimum facet formation. The source of free HCL is controlled by the amount of chlorine combined with silicon in the silicon source gas and the amount of HCl gas introduced. The chlorine introduced by the silicon source gas is converted to free HCl due to the high temperatures (>900° C.) and the abundance of hydrogen from the hydrogen gas. Therefore, depending on the amount of chlorine in the silicon source gas, the amount of HCl introduced controls the ratio of silicon to free HCl.

The length of time for the reactive gases to be present is dependent on the above-given exemplary growth rates and the desired thickness of the so grown epitaxial layers. It is further understood that the desired dopants, such as phosphorus, boron, antimony, or arsenic, may be introduced during the epitaxial layer growth process to grow the layers with the desired conductivity and resistivity.

Due to the relatively low free HCl concentration compared to that in the prior art, it has been found that the facet formation on a epitaxial layer grown using the above-given flow rates is relatively insensitive to the crystallographic plane of the substrate. But it may be preferable to grow the epitaxial layers on a substrate oriented in a <100>, <111>, or <311> direction for best (i.e., a thicker layer before faceting) results.

EXPERIMENTAL RESULTS

Using the first set of exemplary preferred processing parameters with silicon dichlorosilane ($SiCl_2H_2$), 6% of the substrate exposed by openings in a mask, and a pressure of approximately 55 Torr, epitaxial layers of approximately 1.2 microns thick were formed with only 0.1 microns of faceting (h−x of FIG. 1) occurring.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. A method of removing surface damage on a silicon layer in the presence of a silicon dioxide layer, comprising the step of:

subjecting the silicon layer to an etchant of $H_2O:HF$ diluted in $NHO_3$ until substantially all the damage is removed;

wherein the $H_2O:HF$ ratio is diluted to about 10:1 or more and the etchant selectively etches the silicon layer over the silicon dioxide layer.

2. The method of removing residual surface damage as recited in claim 1, wherein the $H_2O:HF$ mixture is diluted in $NHO_3$ at about a 4–10 to 400 ratio.

3. The method of removing residual surface damage as recited in claim 2, wherein the ratio of the $H_2O:HF$ mixture to $NHO_3$ is approximately 6 to 400 and the etchant is held to a temperature in the range of about 20° to 40° C.

* * * * *